United States Patent
Atkins et al.

(10) Patent No.: US 8,035,375 B2
(45) Date of Patent: Oct. 11, 2011

(54) MATERIAL FOR ELECTRICAL ISOLATION AND VIBRO-ACOUSTIC PERFORMANCE

(75) Inventors: Andrew Atkins, Banbury (GB); Scott Roberts, Stratford upon Avon (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 829 days.

(21) Appl. No.: 11/792,818

(22) PCT Filed: Dec. 15, 2005

(86) PCT No.: PCT/EP2005/013515
§ 371 (c)(1),
(2), (4) Date: May 2, 2008

(87) PCT Pub. No.: WO2006/081862
PCT Pub. Date: Aug. 10, 2006

(65) Prior Publication Data
US 2009/0076376 A1    Mar. 19, 2009

(30) Foreign Application Priority Data

Feb. 4, 2005  (GB) .................................. 0502329.6

(51) Int. Cl.
*G01V 3/00* (2006.01)
(52) U.S. Cl. .......................... 324/304; 324/305; 324/318
(58) Field of Classification Search .......... 324/300–322; 600/410–435
See application file for complete search history.

(56) References Cited

U.S. PATENT DOCUMENTS

| | | | |
|---|---|---|---|
| 5,124,651 A * | 6/1992 | Danby et al. ................. | 324/318 |
| 5,168,211 A * | 12/1992 | Laukien et al. ............... | 324/319 |
| 5,201,184 A * | 4/1993 | Roth .............................. | 62/47.1 |
| 5,256,971 A | 10/1993 | Boskamp | |
| 5,281,918 A * | 1/1994 | Lehr .............................. | 324/318 |
| 5,363,845 A * | 11/1994 | Chowdhury et al. ......... | 600/422 |
| 5,396,905 A | 3/1995 | Newman et al. | |
| 5,400,787 A | 3/1995 | Marandos | |
| 5,680,085 A * | 10/1997 | Aihara et al. ................. | 335/216 |
| 6,131,396 A * | 10/2000 | Duerr et al. .................... | 62/51.1 |
| 6,215,307 B1 * | 4/2001 | Sementchenko ............ | 324/318 |
| 6,400,155 B2 * | 6/2002 | Kormos et al. ............... | 324/318 |
| 6,437,672 B1 * | 8/2002 | Takeshima et al. .......... | 335/216 |

(Continued)

FOREIGN PATENT DOCUMENTS

| | | |
|---|---|---|
| JP | 5-29135 A | 2/1993 |
| JP | 2001-137211 | 5/2001 |
| WO | WO 2004/009924 A1 | 1/2004 |
| WO | WO 2004/098870 A1 | 11/2004 |

OTHER PUBLICATIONS http://books.google.com/books?id=Owuv-c9L_IMC& Ipg=PA421& ots=zVxZ4leOhd& dq=is%20 plastic% 20foam% 20porous%3F&pg=PA421#v= onepage& q=is% 20plastic% 20 foam %20porous?&f=false.*

(Continued)

*Primary Examiner* — Dixomara Vargas
(74) *Attorney, Agent, or Firm* — Crowell & Moring LLP

(57) ABSTRACT

The present invention provides a material for the construction of external coverings accessible by humans or animals. It aims to increase the breakdown voltage between a high voltage VRF, high frequency source of energy and the human or animal, by adaptation of materials and structures. According to an embodiment of the invention, a structure is provided for the cover 18 used in MRI or NMR systems, which carries a greater proportion Vs of the voltage VRF across itself, thereby reducing the voltage Vg across the gap 22 and reducing the likelihood of breakdown.

18 Claims, 3 Drawing Sheets

U.S. PATENT DOCUMENTS

| | | | |
|---|---|---|---|
| 6,591,128 B1 * | 7/2003 | Wu et al. | 600/422 |
| 6,650,926 B1 * | 11/2003 | Chan et al. | 600/422 |
| 6,781,492 B2 * | 8/2004 | Takeshima et al. | 335/216 |
| 6,791,327 B2 * | 9/2004 | Skloss | 324/318 |
| 7,148,689 B2 * | 12/2006 | Huang et al. | 324/319 |
| 7,218,195 B2 * | 5/2007 | Laskaris et al. | 335/300 |
| 7,282,915 B2 * | 10/2007 | Giaquinto et al. | 324/318 |
| 7,307,421 B2 * | 12/2007 | Kurome et al. | 324/318 |
| 2001/0051209 A1 | 12/2001 | Silberglitt et al. | |
| 2003/0184292 A1 | 10/2003 | Meyer et al. | |

OTHER PUBLICATIONS http://www.thefreedictionary.com/foam.*

Chris K. Mechefske et al., "Acoustic Noise Reduction in a 4 T MRI Scanner", Magnetic Resonance Materials in Physics, Biology, and Medicine, 2002, pp. 172-176, vol. 13, Elsevier Science B.V.

International Search Report dated May 11, 2006 (PCT/ISA/210) including PCT/ISA/237 (Fourteen (14) pages).

British Search Report dated Jun. 23, 2005 (Two (2) pages).

* cited by examiner

FIG 1 - PRIOR ART
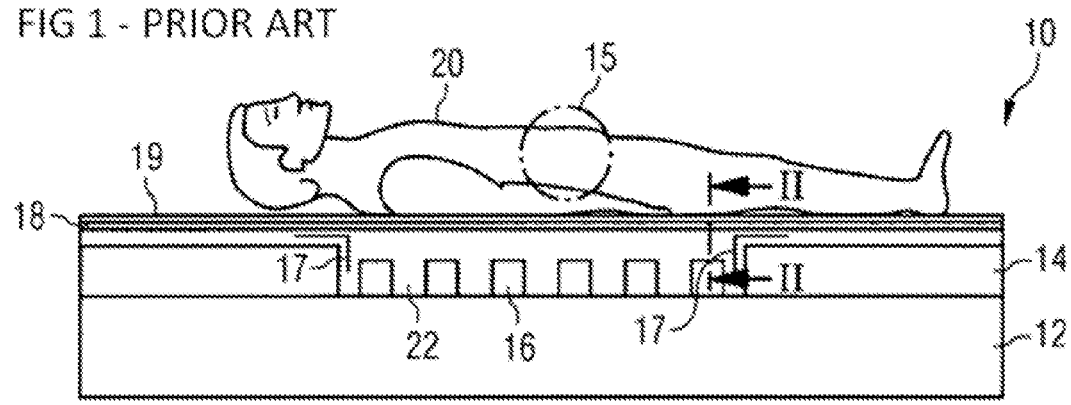
FIG 2 - PRIOR ART
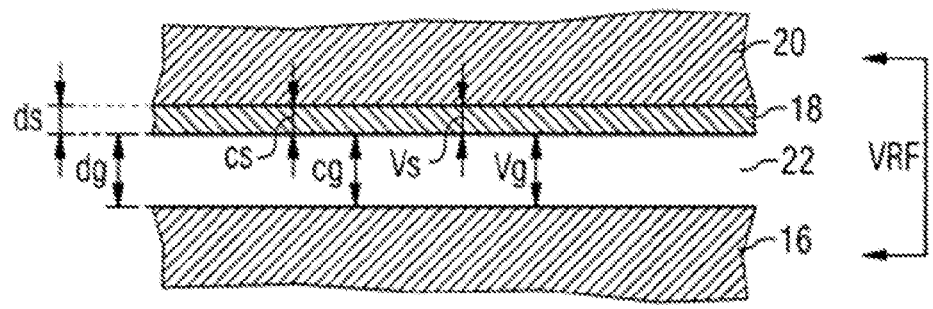
FIG 3A
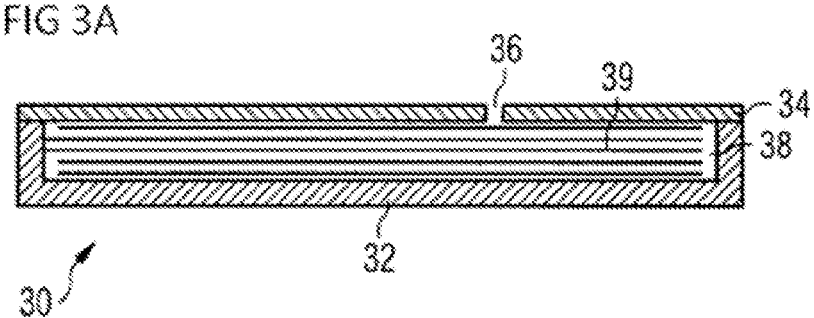

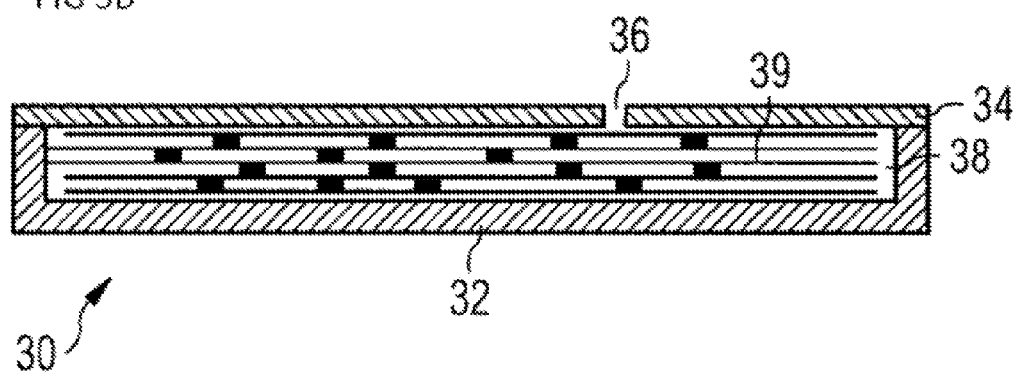
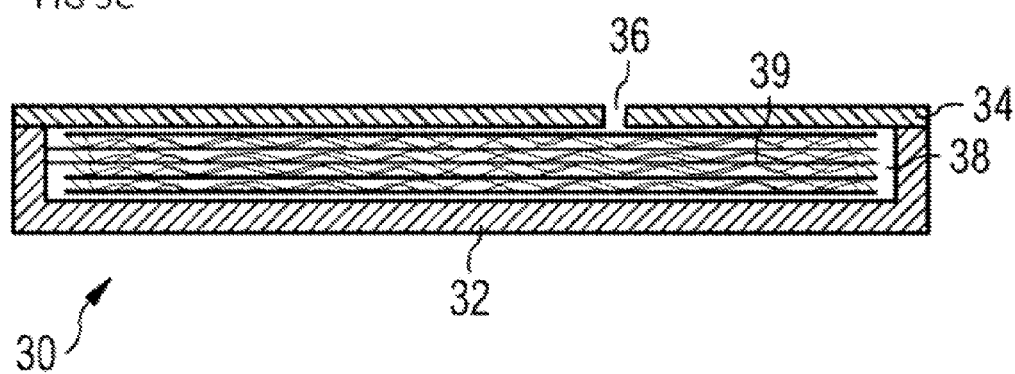

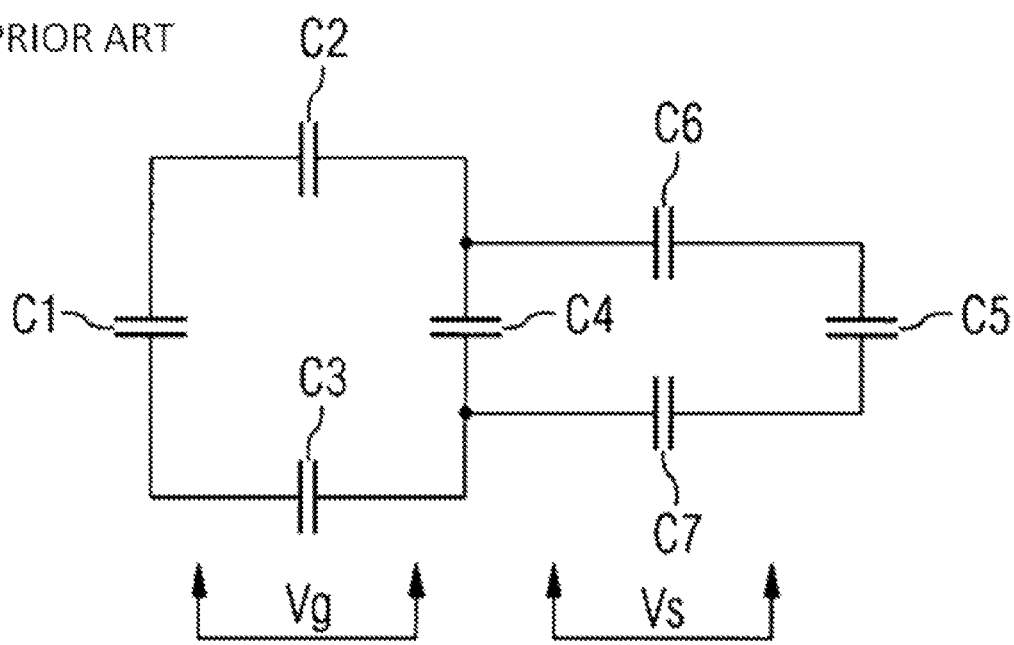
FIG 4 - PRIOR ART
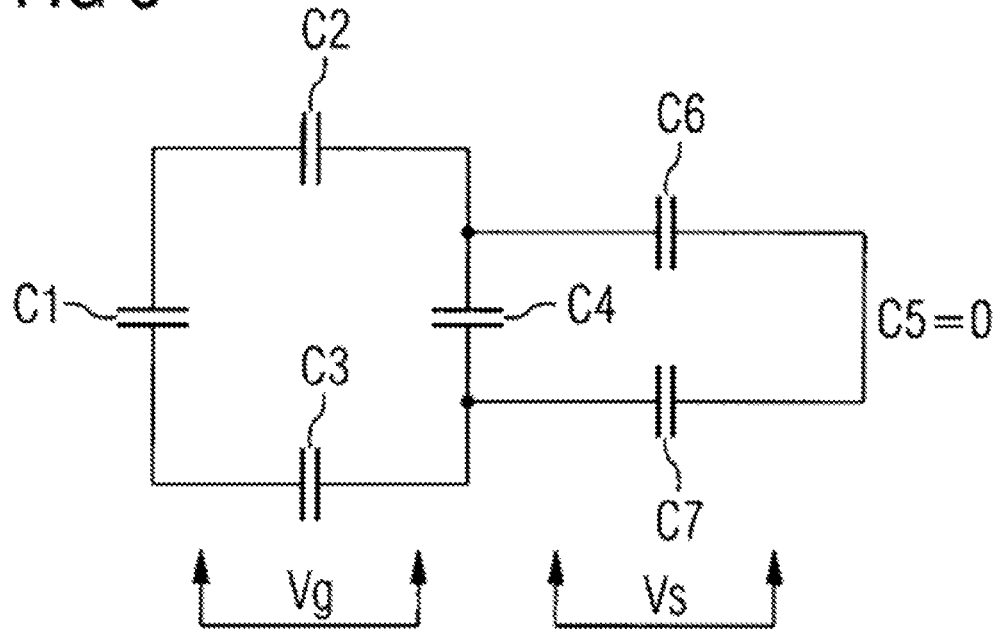
FIG 5

MATERIAL FOR ELECTRICAL ISOLATION AND VIBRO-ACOUSTIC PERFORMANCE

BACKGROUND AND SUMMARY OF THE INVENTION

FIG. 1 shows a partial cross-section of a known MRI (magnetic-resonance imaging) system 10 in operation. A field magnet 12 and gradient coils 14 with edge sections 17 provide a homogeneous magnetic field in an imaging region 15. RF coils 16 generate high energy RF fields, as required for MRI operation. A cover 18 covers the RF coils 16, gradient coils 14 and the field magnet 12. A patient bed 19 may also be provided, which provides support for a patient 20. The cover 18 is contactable by the patient. They patient 20 may contact the cover, for example with arms left to dangle beside the bed. A gap 22 typically exists between the RF coils 16 and the cover 18. The MRI system may be in the form of a cylinder, with the patient placed in the middle of the cylinder. The cover 18 may then form a cylindrical inner surface, for receiving the patient. In such instances, the cover may be referred to as a patient bore liner. The gas pressure in gap 22 may be reduced to 1-100 mbar, in order to reduce the transfer of acoustic noise from the magnet coils 12, 14, 16 to the patient 20.

This invention is concerned with breakdown between any high voltage, high frequency source and a human or animal body in proximity to the high voltage, high frequency source in a partial vacuum. The partial vacuum is present to reduce acoustic noise transfer, but has the unwanted side effect of reducing the breakdown voltage from the magnet coils to the cover.

FIG. 2 shows a partial cross-section of the system of FIG. 1, taken along the line II-II. The electrical properties of the structure of FIG. 2 will now be considered. Due to the nature of the human body, the patient 20 may be considered to be an electrical earth. RF coils 16 produce high voltage, high frequency signals across the gap 22 and the cover 18 to earth at the patient 20.

Simulations performed on one of the applicant's existing products—which includes a high frequency high voltage RF coil—showed RF electrical breakdown between the gradient coil 14 and the inside of the cover 18. The simulation was based on the arrangement shown in FIG. 1. From this simulation, a capacitive model was derived to describe operation of the system in breakdown conditions.

It is important to prevent any voltage breakdown across the gap 22, since such breakdown may cause electrical arcing of high voltage, high frequency RF energy from the RF coils 16 to the patient 20. In some MRI systems, the RF power may attain values in excess of 15 kW. Arcing of such power levels to the patient would cause injury. Considering the voltage distribution in steady state, the high voltage high frequency voltage VRF is split between a voltage drop Vg across the gap 22 and a voltage drop Vs across the material of the cover 18. The patient 20 is conductive and at an assumed ground voltage, so that VRF=Vg+Vs. The relative values of Vs and Vg are determined according to the ratio of the inverse of the respective capacitances Cs, Cg of the corresponding layers. In certain known arrangements, it has been found that 70% of the RF voltage is supported by the gap 22, while 30% is supported by the material of the cover.

FIG. 4 shows a schematic diagram representing the capacitive model as used in the simulations mentioned above. In FIG. 4, C1 represents the capacitance between the RF coils 16; C2 and C3 represent the capacitance of the gap 22 between the gradient coil 14 and the cover 18, at respective ends of the apparatus; C4 represents the surface capacitance of the surface of the cover 18 which is exposed to the gap 22; C6 and C7 represent the capacitance of the material of the cover 18, at respective ends of the apparatus, and C5 represents the surface capacitance of the surface of the cover 18 which is directed toward the patient 20.

When no patient is in contact with the cover 18, the model assumes symmetry of the equipment, such that C2=C3, C4=C5 and C6=C7. With a patient in contact with the cover 18, this symmetry no longer holds. The capacitance C5 falls to zero, since the patient provides a resistive path in good electrical contact with the surface of the cover 18. The model in this state is shown in FIG. 5. With a patient in place, the capacitance C2, C3 of the gap 22 and the capacitance C6, C7 of the material of the cover 18 become dominant in defining the voltage Vg across the gap 22 (FIG. 2). In this situation, the proportion Vg of the total voltage VRF which is borne across the gap 22 is proportional to the distance dg across the gap. This follows from the fact that the capacitance Cg across the gap decreases in proportion to an increase in gap size dg. In order to reduce the likelihood of voltage breakdown between the high voltage, high frequency source (RF coils 16) and the patient, the proportion Vg of the total voltage VRF which is borne across the gap must be reduced, and/or the proportion Vs of the total voltage VRF which is borne across the cover must be increased.

Gap Size

One way of reducing the voltage Vg across the gap and so reduce the likelihood of voltage breakdown across the gap is to increase the capacitance across the gap by reducing the distance dg across the gap.

Permittivity of the Material of the Cover

The voltage Vg across the gap 22, being equal to (VRF−Vs), may be seen to be vary inversely with ds, the thickness of the cover 18, and proportional to $\epsilon_{rs}$, the relative permittivity of the material of the cover 18. This follows from the fact that the capacitance Cg across the gap increases in proportion to $\epsilon_{rs}$; while the capacitance Cs across the cover decreases in proportion to an increase in thickness ds. In an embodiment, $\epsilon_{rs}$ may be about 4.

Accordingly, the voltage Vg across the gap 22, which should be minimised, follows the following relationship:

$$Vg \propto \epsilon_{rs}.dg/ds.$$

To achieve minimum Vg, one must minimise $\epsilon_{rs}$, the relative permittivity of the material of the cover 18, while reducing the thickness dg of the gap and/or increasing the thickness ds of the material of the cover 18.

Gas Pressure & Gap Thickness—Paschen's Law

Another aspect affecting the electrical breakdown voltage of a medium is the electrical strength of the medium. Paschen's law states that the breakdown voltage for a discharge between electrodes in gas is a function of the product (pd) of the pressure of the gas, and the distance between the electrodes. The function has a minimum value for air at pd=0.55 Torr cm (0.733 Nm$^{-1}$), indicating a breakdown voltage 352 V between electrodes 0.01 m apart. In one expression of the Paschen equation, the breakdown voltage $V^b_g$ of a gap in air is given by:

$$V^b_g = 6.72\sqrt{(pd)} + 24.36(pd) \text{ kV}.$$

Since we wish to increase the breakdown voltage across the gap, thereby to reduce the likelihood of voltage breakdown across the gap, operation at the Paschen minimum value must be avoided. Operation with a pressure distance (pd) product above or below that of the Paschen minimum will provide an improved breakdown resistance.

In known MRI systems, the air or other gas in the gap 22 is typically at a very low pressure but above the Paschen minimum. This will reduce the breakdown voltage of the gap 22 from that of an equivalent gap filled with air at atmospheric pressure. Since the gap usually contains gas at less than atmospheric pressure, there is a risk of electrical breakdown. It would be advantageous to increase the pressure of the gas in the gap, since the present invention aims to reduce the risk of electrical breakdown across the gap 22. However, this is not a practical proposition since acoustic noise transfer through the gap would increase.

For an example of the system considered by the present invention, a gap of 0.005 m in air at a pressure of 75 Torr (10000 Nm$^{-2}$), a pressure-distance product pd of 37.5 Torr cm (50 Nm$^{-1}$), gives a breakdown voltage of approximately 2.8 kV. This is well above the Paschen minimum. The same gap filled with air at atmospheric pressure, giving a pressure-distance product pd of 507 Nm$^{-1}$, would have a breakdown voltage of about 16.9 kV; a marked improvement over the breakdown voltage for the low-pressure gap.

On the other hand, if the pressure of the gas in the gap is reduced, less acoustic noise would be transmitted to the patient 20 from the MRI system 10. The reduced pressure gas is less efficient as a transport medium for sound. Since the patient 20 may be enclosed in a relatively small cylindrical enclosure, it is important to reduce the acoustic noise heard by the patient, since high levels of acoustic noise could increase a patient's feeling of stress when contained in the cylindrical enclosure. However, a reduced pressure of the gas in the gap 22 would lead to a lower breakdown voltage across the gap.

There are accordingly conflicting requirements for the pressure of the gas in gap 22. A reduced pressure is desirable for reduction of acoustic noise transmission, while an increased pressure is desired for increasing the breakdown voltage of the gap.

Reactance of Material of the Cover

An electrical breakdown of the gap 22 would in effect provide a resistive path between the high voltage, high frequency source (RF coils 16) and the patient 20. This could be harmful to the patient. By restricting the connection between the high voltage, high frequency source (RF coils 16) and the patient to a capacitive one, this risk is eliminated. The present invention aims to reduce the possibility of a resistive path being established between the high voltage, high frequency source (RF coils 16) and the patient 20.

To further reduce the proportion Vg of the total voltage VRF across the gap 22, the proportion Vs held across the material of the cover 18 may be increased. This may be achieved by providing a material of the cover 18 of higher reactance X.

OBJECT OF THE INVENTION

The invention aims to provide a cover and a material for making the cover, which have a much higher electrical reactance X than known arrangements. The material may be applied to the manufacture of any cover for a high frequency high voltage source which is accessible to humans or animals.

In particular, the invention aims to increase the breakdown voltage between the RF coils and the patient, in MRI or NMR systems, by adaptation of materials and structures by one or more of the above-described effects.

The invention further aims to provide, a material for cover 18 and other protective covers intended to separate humans or animals from high frequency high voltage sources, which carries a greater proportion Vs of the voltage VRF across itself, thereby reducing the proportion Vg across the gap 22 and reducing the likelihood of voltage breakdown across the gap.

Accordingly, the present invention provides materials and structures as defined in the appended claims.

In certain embodiments of the present invention, there is provided a cover and a material for a cover for use in NMR or MRI systems, which is damped to minimise the transmission of airborne noise; which is mechanically strong enough to withstand static loads of atmospheric pressure to vacuum; which has sufficient electrical properties to inhibit the breakdown of the RF energy in the gap and to the patient; which minimises loading on the RF system; which is RF transparent; and complies with the relevant fire ratings. The mechanical load capability must at least match the maximum rated load on the bed, typically set at four times the expected maximum patient weight—for example 800 kg or 100,000 Nm$^{-2}$.

BRIEF DESCRIPTION OF THE DRAWING FIGURES

The above, and further, objects, characteristics and advantages of the present invention will be further explained by reference to certain embodiments, given by way of examples only, with reference to the accompanying drawings, wherein:

FIG. 1 shows a partial cross-section of a known MRI system;

FIG. 2 shows a partial cross-section of the system of FIG. 1;

FIGS. 3A-3C show a cross section of a material/structure according to embodiments of the present invention;

FIG. 4 shows a capacitive model used for simulation of electrical characteristics of the system of FIG. 1; and FIG. 5 shows the capacitive model of FIG. 4 adapted to simulate the presence of a patient in the MRI system.

DETAILED DESCRIPTION OF THE DRAWING FIGURES

In order to reduce the likelihood of voltage breakdown between the source of high frequency high voltage energy and the patient 20, the invention may employ some of the following techniques, identified above as being of potential utility:

reduction in the gap size dg;

increase the thickness ds of the cover;

minimise $\epsilon_{rs}$, the relative permittivity of the material of the cover;

increase the reactance X of the material of the cover;

increase the pressure of the gas in the gap.

Conflicting with this final technique is the requirement to reduce noise transmission to the patient, which may be achieved by lowering the pressure of the gas in the gap.

FIGS. 3A-3C show a cross-section of a material 30 for the construction of covers in MRI systems according to embodiments of the present invention. Such material finds application in the manufacture of any cover intended to separate humans or animals from high voltage high frequency sources. It is of particular advantage for enclosures which house such sources in a partial vacuum. A tray shaped element 32 is provided, in a first material. A porous covering 34 is provided in a second material. The first and second materials may be the same material. The porosity of the second material may be provided by pores or holes 36 in the covering. The tray and the covering define an enclosed cavity 38. The enclosed cavity 38 may contain foils 39 of an electrically non-conductive material.

In order to obtain the required protection for a patient 20, or other human or animal, a single tray structure such as shown in FIGS. 3A-3C must be provided, covering the whole region of interest.

In an embodiment of the invention, the tray 32 and the cover 34 may be made from fire retardant materials, meeting the relevant requirements for fire retardance, for example the ULV0 standard.

The material of FIGS. 3A-3C contrasts with a simple prior-art material used for making covers, for example: fibreglass reinforced resin; by containing cavity 38. This cavity may be filled with air at atmospheric pressure, due to the porous nature 36 of the covering 34. An air filled cavity 38 offers a higher breakdown voltage than a solid material, or an equivalent cavity filled with a gas at reduced pressure. The material may be constructed of layers 32, 34 each having a thickness of approximately one-half of the thickness of the solid material of the prior art. However, it may be advantageous to provide one layer 32, 34 somewhat thicker than the other, to reduce the chance of the material entering a state of acoustic resonance. The material of the invention is nonetheless strong enough to serve as a structural material.

The air-filled structure 30, optionally with layers of electrically non-conductive foil 39 laid in the cavity 38, prevents an electrically resistive path being established from the high frequency, high voltage source (RF coils 16) to the patient 20. A resistive path to the patient could only arise in the case of a voltage breakdown of the structure 30. The materials chosen for the structure of FIGS. 3A-3C should be transparent to RF signals at the frequency of interest, and should preferably be lightweight to ease handling and dismantling.

The tray 32 may have dimensions of typically 3-4 mm wall thickness, with a 1 mm thick top cover 34 and a 2 mm deep cavity 38. The inventors have found that the voltage required to provide electrical breakdown of the structure 30 of the present invention having such dimensions is in the order of 9-17 kV, which compares very favourably with the breakdown voltage of a solid layer of fibreglass reinforced resin, which had previously been used as the material of cover 18.

The tray 32 provides mechanical strength sufficient for its role as a vacuum chamber. The cover 34 preferably provides a pleasant surface finish for the cover, and adds to the structural stiffness of the structure as a whole. A series of foils 39 may be placed within the tray. These foils 39 are electrically non-conductive and break up the space within the tray to offer acoustic damping, by acting as baffles. The cover 34 is porous 36. This means that the cavity 38 which may contain foils 39 is at atmospheric pressure. This increases the breakdown voltage across the structure. The foils may be foils of MYLAR® polyester film. The foils may be held apart by separators such as bars (see FIG. 3B) or gauze (see FIG. 3C). The foils could be corrugated or otherwise textured to provide separation. In alternative embodiments, the cavity 38 may be filled with an open celled foam to hold the foils apart.

In an example embodiment, having a tray 32 with fibreglass reinforced resin walls 4 mm thick and a cover 34 4 mm thick, each of a material of $\epsilon_{rs}=4$, and with four MYLAR® polyester film foils 39 in the cavity 38, a capacitance chain is created, providing a cover structure of capacitance C6, C7 of $166\psi$ $Fm^{-2}$, where $\psi$ is a constant. By contrast, a cover 18 constructed from a solid 8 mm thick layer of the same material having $\epsilon_{rs}=4$ provides a capacitance of $500\psi$ $Fm^{-2}$. A gap 22 of 5 mm will provide a capacitance of $200\psi$ $Fm^{-2}$. Using this example embodiment, since the total voltage VRF across the gap 22 and cover 18 will distribute in inverse proportion to the series capacitances, an increased proportion Vs ($Vs=200\psi/366\psi \times VRF=0.55 \times VRF$) of the voltage VRF is taken across the material of the cover 18, with a correspondingly reduced proportion Vg ($Vg=166\psi/366\psi \times VRF=0.45 \times VRF$) being taken across the gap 22. For comparison, the equivalent values for the solid 8 mm thick layer of fibreglass reinforced resin would be $Vs=200\psi/700\psi \times VRF=0.29 \times VRF$; $Vg=500\psi/700\psi \times VRF=0.71 \times VRF$.

With the described embodiment of the material of the present invention, the proportion Vg of the total voltage VRF which is borne across the gap 22 is approximately 0.55 VRF. This compares very favourably with an equivalent system having the solid material, in which the proportion Vg is approximately 0.71 VRF. The reduced voltage across the gap when using a cover of the material of the present invention directly leads to a reduced likelihood of voltage breakdown across the gap.

Another means to reduce the proportion Vg of the voltage VRF across the gap 22 is to reduce the thickness dg of the gap. If possible, the gap 22 could be reduced to 1 mm. In this case, the voltage Vg dropped across the gap when using the material of the present invention for the cover 18 would be 0.16 VRF, a further reduction in Vg and correspondingly a further reduction in the likelihood of voltage breakdown across the gap.

The tray 32 and the cover 34 may be constructed from a material according to International patent application WO 2004/009924 or International patent application WO 2004/098870. Each of these documents describes a respective structurally capable material with effective damping properties.

The present invention accordingly provides a cover and a material for a cover, which adopts the following techniques, in respective certain embodiments, to reduce the likelihood of voltage breakdown between the high frequency, high voltage energy source and the patient 20.

Reduction in the Gap Size dg

The size of the gap 22 may be reduced as far as is practicable, bearing production and maintenance issues in mind.

Increase the Thickness ds of the Cover

The material 30 and cover of the present invention has increased thickness compared with a known cover, for a same weight of material due to the inclusion of an air filled cavity 38 between the respective surfaces of the material.

Minimise $\epsilon_{rs}$, the Relative Permittivity of the Material of the Cover.

The permittivity of the material of the cover is reduced by inclusion of an air filled cavity ($\epsilon_r \approx 1$) between the respective surfaces of the cover.

Increase the Reactance X of the Material of the Cover.

At a fixed frequency of operation, reactance X is inversely proportional to capacitance, $X \propto 1/C$. As described above, the present invention serves to reduce the capacitance of the bed by two-thirds. This reduction in capacitance gives rise to a corresponding increase in reactance of the cover.

Increase the Pressure of the Gas in the Gap.

By providing air filled cavities 38 between the respective surfaces of the cover, a second gap is effectively provided, containing air at atmospheric pressure, and having a correspondingly higher breakdown voltage than gap 22, which is typically filled with gas at a very low pressure.

Reduce Noise Transmission to the Patient by Lowering the Pressure of the Gas in the Gap.

Since the cover and material of the invention includes high pressure gaps in the enclosed cavities 38, it is possible to maintain a low gas pressure in the gap 22 yet still provide reduced likelihood of breakdown to the patient. By maintaining a low gas pressure in the gap 22, sound insulation may be maintained.

The optional presence of foils 39 within cavity 38 serves to further reduce noise transmission, by said foils acting as baffles.

Use of the material of the present invention may provide the following advantages. The cover may be located closer to the high voltage high frequency source. This in turn means that a smaller overall enclosure is required. In the field of solenoidal MRI or NMR imaging systems, this means either that the central patient bore may increase in diameter for a same size magnet arrangement, or that a smaller magnet arrangement may be used to provide a given dimension of patient bore. Each of these advantages contributes to the manufacture of more attractive products. In the first case, a larger patient bore means that a greater proportion of the human population fall within the size range which could be accommodated within the bore. In the second case, a smaller and less expensive magnet may be used to provide the same patient bore size, leading to less expensive or more profitable imaging systems.

While the present invention has been described with particular reference to covers, or patient bore liners, for MRI or NMR apparatus, the material of the present invention may usefully be applied to the manufacture of covers for any high voltage, high frequency source which would otherwise present a risk of breakdown to a human or animal body.

The invention claimed is:

1. A structural material for the construction of external coverings for high voltage, high frequency sources, said coverings being contactable by humans or animals, comprising:
 a covering insertable into an MRI system, the covering having a first section and a second section, wherein
  the first section is a first element made of a first material;
  the second section is a porous covering made of a second material;
  the second section is located on top of the first section to form an enclosed cavity defined between the first element and the porous covering, wherein the porosity of the porous covering is provided by pores or holes in porous the covering, and the enclosed cavity is in communication with the atmosphere through the pores or holes of the porous covering, wherein the porous covering is in the form of a sheet that encloses the cavity,
 a thickness of the first element and the porous covering is on an order of millimeters.

2. A material according to claim 1 wherein the first element comprises a tray shaped recess, said recess being closed by the porous covering to form that enclosed cavity.

3. A material according to claim 1 wherein the first and second materials are a same material.

4. A material according to claim 1 wherein the enclosed cavity contains foils of electrically non-conductive material.

5. A material according to claim 4 wherein the foils are foils of polyester film.

6. A material according to claim 4 wherein the foils are corrugated or otherwise textured to provide separation.

7. A material according to claim 1 wherein one of the first element and the porous covering is thicker than the other one, thereby to reduce the chance of the material entering a state of acoustic resonance.

8. A cover for an MRI system comprising a material according to claim 1.

9. An MRI system comprising a cover according to claim 8.

10. A high voltage high frequency source housed within a cover formed of a material according to claim 1.

11. A high voltage high frequency source housed within a cover, according to claim 10, wherein a partial vacuum exists between the source and the cover.

12. A structural material for the construction of external coverings for high voltage, high frequency sources, said coverings being contactable by humans or animals, comprising:
 a covering insertable into an MRI system, the covering having a first section and a second section, wherein
  the first section is a first element made of a first material;
  the second section is a porous covering made of a second material;
  the second section is located on top of the first section to form an enclosed cavity defined between the first element and the porous covering, wherein the porosity of the porous covering is provided by pores or holes in the porous covering, and the enclosed cavity is in communication with the atmosphere through the pores or holes of the porous covering,
  the enclosed cavity contains foils of electrically non-conductive material,
  the foils are held apart by separators, the separators being bars or gauze, and
 a thickness of the first element and the porous covering is on an order of millimeters.

13. A device comprising:
 a covering insertable into an MRI system, the covering having a first section and a second section, wherein
  the first section is a first element having tray shape with a sheet-like base and two side elements that are substantially perpendicular to the sheet-like base; and
  the second section is a porous covering made of a second material,
  an enclosed cavity is formed between the porous covering and the first element with the porous covering overlapping the two side elements and the enclosed cavity is in communication with the atmosphere only through pores or holes of the porous covering,
 a thickness of the first element and the porous covering is on an order of millimeters.

14. The cover of claim 13, wherein the first and second materials are a same material.

15. The cover of claim 13, wherein the enclosed cavity contains foils of electrically non-conductive material.

16. The cover of claim 15, wherein the foils are foils of polyester film.

17. The cover of claim 15, wherein the foils are held apart by bar or gauze separators.

18. The cover of claim 15, wherein the foils are corrugated or otherwise textured to provide separation.

* * * * *